(12) United States Patent
Lin

(10) Patent No.: US 11,538,711 B2
(45) Date of Patent: Dec. 27, 2022

(54) METHODS FOR EDGE TRIMMING OF SEMICONDUCTOR WAFERS AND RELATED APPARATUS

(71) Applicant: Micron Technology, Inc., Boise, ID (US)

(72) Inventor: Jing-Cheng Lin, Hsinchu (TW)

(73) Assignee: Micron Technology, Inc., Boise, ID (US)

( * ) Notice: Subject to any disclaimer, the term of this patent is extended or adjusted under 35 U.S.C. 154(b) by 1105 days.

(21) Appl. No.: 16/042,597

(22) Filed: Jul. 23, 2018

(65) Prior Publication Data

US 2020/0027773 A1 Jan. 23, 2020

(51) Int. Cl.
| | |
|---|---|
| *B23D 61/02* | (2006.01) |
| *H01L 21/683* | (2006.01) |
| *B26D 7/18* | (2006.01) |
| *B26D 1/143* | (2006.01) |
| *H01L 21/304* | (2006.01) |
| *B24D 5/02* | (2006.01) |
| *H01L 21/78* | (2006.01) |

(52) U.S. Cl.
CPC ........ *H01L 21/6836* (2013.01); *B23D 61/021* (2013.01); *B24D 5/02* (2013.01); *B26D 1/143* (2013.01); *B26D 7/18* (2013.01); *H01L 21/304* (2013.01); *H01L 21/78* (2013.01)

(58) Field of Classification Search
CPC ... H01L 21/6836; H01L 21/304; H01L 21/78; B23D 61/021
See application file for complete search history.

(56) References Cited

U.S. PATENT DOCUMENTS

| | | | |
|---|---|---|---|
| 8,415,232 B2 | 4/2013 | Kajiyama et al. | |
| 9,040,389 B2 | 5/2015 | Mackh et al. | |
| 9,437,439 B2 | 9/2016 | Priewasser | |
| 9,601,437 B2 | 3/2017 | Albermann et al. | |
| 9,676,114 B2 | 6/2017 | Kuo et al. | |
| 9,716,023 B2 | 7/2017 | Farrens et al. | |
| 9,748,140 B1 * | 8/2017 | Hedenig | H01L 21/68785 |
| 10,580,753 B2 * | 3/2020 | Mischitz | H01L 23/3171 |
| 2012/0289028 A1 | 11/2012 | Abatake | |
| 2015/0044857 A1 | 2/2015 | Matsuzaki et al. | |
| 2016/0155656 A1 * | 6/2016 | Matsumura | H01L 21/6838 438/464 |
| 2016/0343564 A1 | 11/2016 | Indyk et al. | |

OTHER PUBLICATIONS

Disco Technical Review, The Effects of Edge Trimming, Engineering R & D Division, Operation V, Mar. 2016, 3 pages.
Hamamatus, Stealth Dicing Technology and Applications, Technical Information, https://www.hamamatsu.com/resources/pdf/etd/SD_tech_TLAS9004E.pdf, Mar. 2005, 8 pages.

* cited by examiner

*Primary Examiner* — Pho M Luu
(74) *Attorney, Agent, or Firm* — TraskBritt

(57) ABSTRACT

Methods and apparatus for pre-treating semiconductor wafers before edge trimming to enhance wafer edge quality prior to thinning the semiconductor wafers from an initial thickness, and increasing yield post-thinning of the pre-treated, edge trimmed semiconductor wafers.

22 Claims, 5 Drawing Sheets

000
METHODS FOR EDGE TRIMMING OF SEMICONDUCTOR WAFERS AND RELATED APPARATUS

TECHNICAL FIELD

Embodiments disclosed herein relate to edge trimming of semiconductor wafers. More particularly, embodiments disclosed herein relate to methods and apparatus for enhancing edge quality in edge trimming of a semiconductor wafer prior to thinning the semiconductor wafer from an initial thickness.

BACKGROUND

As electronics have become more sophisticated, while at the same time more miniaturized, a widely-used process has been developed to substantially thin semiconductor (e.g., silicon) wafers from an initial thickness of, for example, about 650 µm to about 750 µm. Integrated circuitry comprising a large number of semiconductor dice is fabricated on an active surface of the wafer at its initial thickness, after which the wafer is thinned from the back side thereof to an end thickness of, for example about 40 µm to about 70 µm by an abrasive process termed "back grinding," which may be followed by a chemical etch or plasma etch process to enhance smoothness of the back side topography or, in some instances, by chemical mechanical planarization (CMP) to expose ends of conductive through vias, commonly termed "through silicon vias," or TSVs. Prior to thinning, it is also conventional to perform a so-called "edge trim" process, wherein a portion of the rounded profile outer periphery of the semiconductor wafer is removed to a selected depth, after which the thinning process is performed. Edge trimming may reduce or even eliminate the potential for edge chipping of the semiconductor wafer attributable to the rounded profile during back grinding, but the edge trim process itself may induce chipping of the periphery of the active surface radially inward of the trimmed edge.

FIGS. 1A through 1C schematically depict a conventional semiconductor wafer edge trim process before the wafer is bonded by its active surface to a carrier wafer. As shown in FIG. 1A, semiconductor wafer 100, which may also be termed a "device wafer," is placed on a rotatable platform, which may also be characterized as a stage S, with its active surface 102 facing upwardly. Such an orientation and used of a rotatable platform for edge trimming is conventional. As semiconductor wafer 100 is rotated by stage S about central axis $A_1$, a blade 104 of a width of, for example, about 0.5 mm to about 3 mm (depending on desired edge trim width) rotating about an axis $A_2$ perpendicular to axis $A_1$ along a radius from axis $A_1$ is placed in contact with the active surface 102 radially outward from any integrated circuitry and gradually lowered to remove a depth and width of peripheral semiconductor material and form trimmed edge 106, conventionally oriented at a 90° angle to the plane of semiconductor wafer 100. The semiconductor material may be removed, for example, to a depth of from about 130 µm to about 200 µm and to a width inwardly from peripheral edge 108 of semiconductor wafer of from about 300 µm to about 500 µm. After edge trim is performed, semiconductor wafer 100 is inverted and adhered to a carrier wafer 200 with a temporary adhesive 202, as shown in FIG. 1B. Semiconductor wafer 100 is then thinned by back grinding, followed by chemical etching, plasma etching or CMP, as noted above, to a final thickness of, for example, about 70 µm to about 40 µm, as shown in FIG. 1C. The extreme thinning of state of the art semiconductor wafers renders the semiconductor material of the wafers ever more susceptible to edge chipping during edge trim, as well as to cracking during such processing and further processing. Edge chipping responsive to a conventional edge trim process is shown in FIG. 2. Back grinding, as well as CMP if employed to remove the grind marks to a depth of about 6 µm, may cause chipping of the active surface edge or even crack propagation into the wafer as greater stress is applied in that area by these processes.

The inventor herein has recognized that improvements in the edge trim process are desirable to enhance yield from edge trimmed semiconductor wafers, and has developed embodiments of such improvements as described herein and illustrated in the accompanying drawings.

DETAILED DESCRIPTION

Figure 1A:
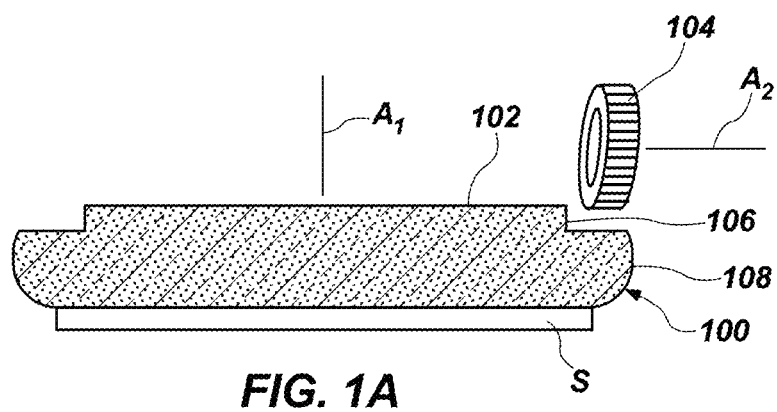
FIGS. 1A through 1C are schematic side elevations illustrating a conventional edge trim process, followed by thinning, for a semiconductor wafer.
Figure 1B:
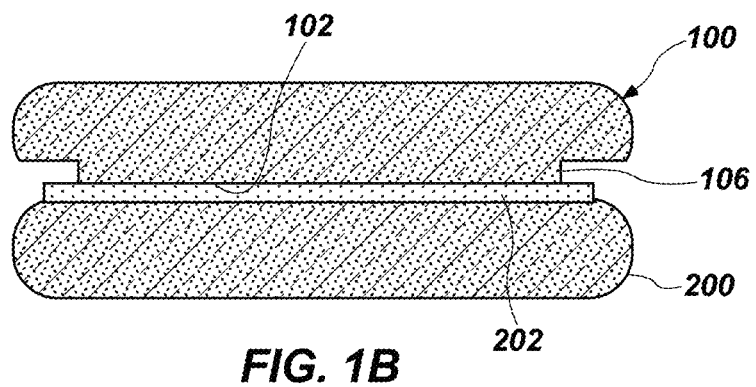
Figure 1C:
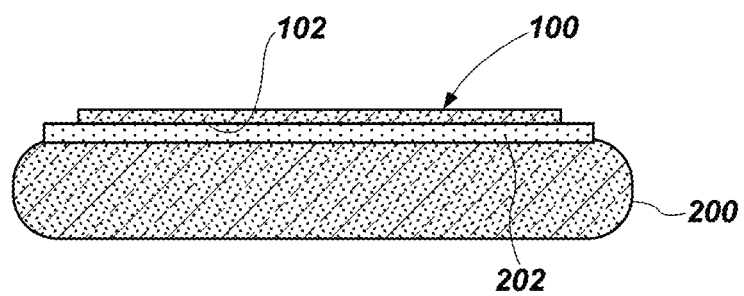
Figure 2:
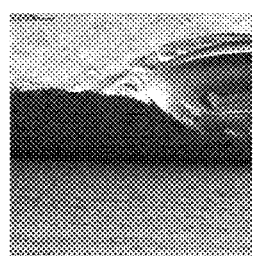
FIG. 2 is a photograph of a chipped edge of a semiconductor wafer active surface resulting from the conventional edge trim process.

Methods and apparatus for semiconductor wafer edge trimming and wafer thinning are described below.

The following description provides specific details, such as sizes, shapes, material compositions, and orientations in order to provide a thorough description of embodiments of the disclosure. However, a person of ordinary skill in the art would understand that the embodiments of the disclosure may be practiced without necessarily employing these specific details. Embodiments of the disclosure may be practiced in conjunction with conventional fabrication techniques employed in the industry. In addition, the description provided below does not form a complete, detailed process flow for edge trimming and thinning a semiconductor wafer, or apparatus for edge trimming and thinning. Only those process acts and structures necessary to understand the embodiments of the disclosure are described in detail below. Additional acts, for example, to form a complete edge trimmed and thinned semiconductor wafer may be performed by conventional fabrication processes. Similarly, apparatuses for performing edge trimming and thinning according to embodiments of the disclosure, unless otherwise described herein, may be taken as conventional.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles between surfaces that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale.

As used herein, the terms "comprising," "including," "containing," "characterized by," and grammatical equivalents thereof are inclusive or open-ended terms that do not exclude additional, unrecited elements or method acts, but also include the more restrictive terms "consisting of" and "consisting essentially of" and grammatical equivalents thereof. As used herein, the term "may" with respect to a material, structure, feature or method act indicates that such is contemplated for use in implementation of an embodiment of the disclosure and such term is used in preference to the more restrictive term "is" so as to avoid any implication that other, compatible materials, structures, features and methods usable in combination therewith should or must be, excluded.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by Earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, spatially relative terms, such as "beneath," "below," "lower," "bottom," "above," "over," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "over" or "above" or "on" or "on top of" other elements or features would then be oriented "below" or "beneath" or "under" or "on bottom of" the other elements or features. Thus, the term "over" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, the terms "configured" and "configuration" refer to a size, shape, material composition, orientation, and arrangement of one or more of at least one structure and at least one apparatus facilitating operation of one or more of the structure and the apparatus in a predetermined way.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, the term "about" in reference to a given parameter is inclusive of the stated value and has the meaning dictated by the context (e.g., it includes the degree of error associated with measurement of the given parameter).

As used herein, the terms "layer" and "film" mean and include a level, sheet or coating of material residing on a structure, which level or coating may be continuous or discontinuous between portions of the material, and which may be conformal or non-conformal, unless otherwise indicated.

As used herein, the term "substrate" means and includes a base material or construction upon which additional materials are formed. In the context of this disclosure, a substrate may be a semiconductor substrate configured as a substantially circular semiconductor wafer having one or more materials, layers, structures, or regions formed thereon. The materials on the semiconductor substrate may include, but are not limited to, semiconductor materials, insulating materials, conductive materials, etc. The substrate may be a conventional silicon substrate or other substrate comprising semiconductor or optoelectronic materials, for example, silicon-germanium, germanium, gallium arsenide, gallium nitride, and indium phosphide. The substrate may be doped or undoped.

In the specification and with reference to the accompanying drawing figures, the same or similar elements are identified by the same or similar reference numerals for the sake of clarity.

Figure 3A:
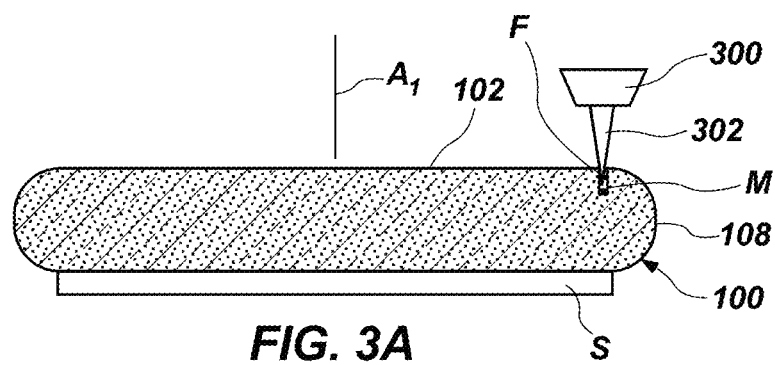
FIGS. 3A through 3D are schematic side elevations illustrating an embodiment of an edge trim process according to the disclosure, followed by thinning, for a semiconductor wafer.
Figure 3B:
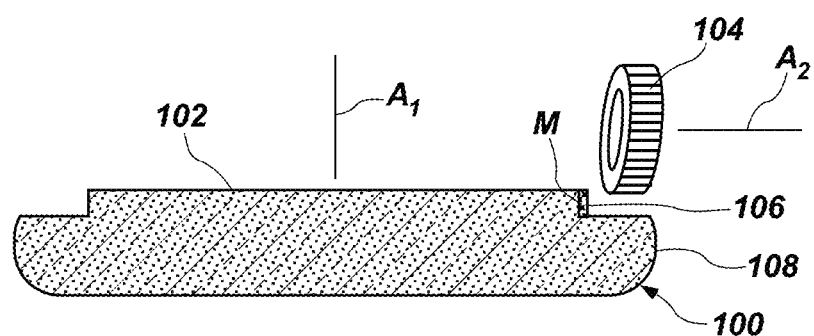
Figure 3C:
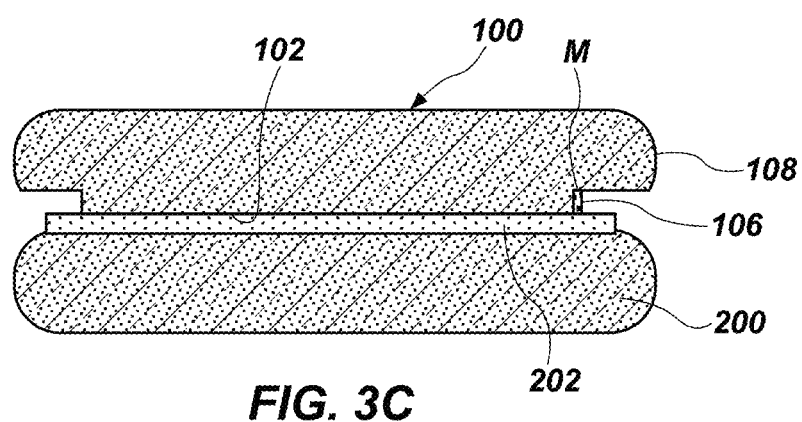
Figure 3D:
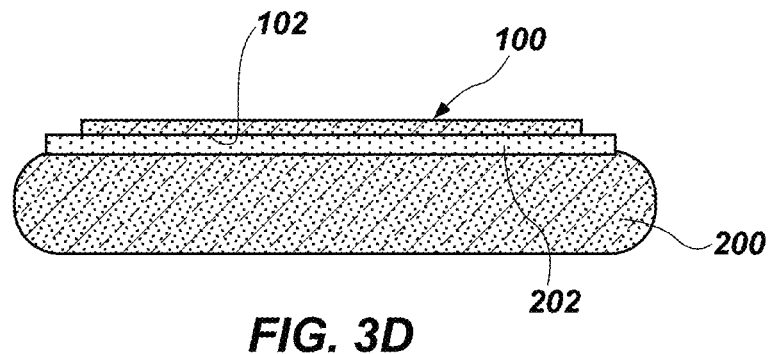
Figure 4:
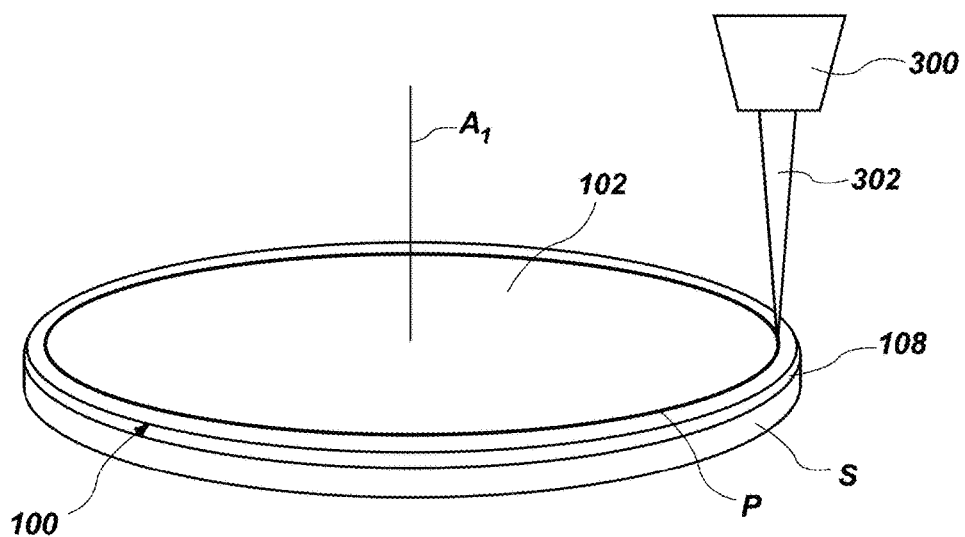
FIG. 4 is an enlarged perspective view of a laser apparatus generating a beam focused and positioned for use in FIG. 3A of the foregoing embodiment.

FIGS. 3A through 3D and 4 illustrate an embodiment of an edge trim process according to the disclosure. As shown in FIGS. 3A and 4, a device wafer 100 is placed on a platform, which may also be characterized as a stage S, with its active surface 102 facing upwardly. Stage S may either be fixed, or rotatable. If stage S is fixed, a laser beam 302 of a laser tool 300 programmed to follow a circular path P about vertical central axis $A_1$ of device wafer is aimed vertically downward and focused within a depth of the device wafer 100 below incident active surface 102 along path P adjacent to and inwardly from peripheral edge 108 of device wafer 100, radially outward of any integrated circuitry (not shown) of die locations on active surface 102. If stage S is rotatable, device wafer 100 is rotated about its central axis $A_1$ while laser tool 300 remains fixed at a selected radial distance from axis $A_1$ and laser beam 302, aimed vertically downward, is focused within a depth of the device wafer 100 below incident active surface 102 along path P at the selected radial distance adjacent to and inwardly from peripheral edge 108 of device wafer 100, radially outward of any integrated circuitry (not shown) of die locations on active surface 102.

The laser tool employed and the focal point of the laser beam generated may be similar to those used in a so-called "stealth dicing" process, tools for which are offered by, among others, Disco Corporation of Tokyo, Japan, Hamamatsu Photonics K.K. of Shizuoka, Japan, and NXP B.V. of Eindhoven, Netherlands. In such a process, the focal point of the laser beam, which is within a range of wavelengths at least semitransparent to, and transmissible through, the material of the device wafer, is set inside of the device wafer 100 to form a number of modified regions, which may also be characterized as modified zones M, of semiconductor material in a stressed state including, for example, recrystallized polycrystalline material of the wafer, microcracks, dislocations and other defects, etc. Such modified zones may extend circumferentially around device wafer 100, inwardly of peripheral edge 108 thereof. Suitable laser tools may comprise infrared pulsed lasers, for example a diode-pumped pulsed neodymium-doped yttrium aluminum garnet laser crystal (Nd:YAG) source, neodymium, doped yttrium orthovandadate (Nd:YVO4), or neodymium-doped yttrium fluoride (Nd:YLF). Suitable laser tools for use, for example with monocrystalline silicon semiconductor material may operate at wavelengths including those, for example, greater than about 900 nm to allow the laser beam 302 to be focused onto regions of semiconductor material within device wafer 100. An example of a suitable laser tool 300 is an LD pumped Q-switched Nd:YVO4 pulsed laser, generating laser beam 302 at a wavelength of 1064 nm, a repetition frequency of 100 kHz, a pulse width of 40 ns, an average power of one W and a focused spot diameter of 1 µm. An example of a suitable rotational speed for device wafer 100 about axis $A_1$, as measured at the line of impingement of laser beam near peripheral edge 108 of device wafer 100, is 100 mm/s. Multiple scans (i.e., scans during multiple 360° wafer rotations) of device wafer 100 by laser beam 302 may be effected to reach a desired depth within device wafer 100. The focal point F of laser beam 302 may, optionally, be adjusted after each rotation or sequence of rotations to reach a desired maximum depth for the modified zones M. The focal point F may, initially, be located at a maximum desired depth for edge trim to be performed within device wafer 100 and gradually withdrawn to lesser depths ultimately approaching but not on active surface 102, or the focal point F may be initially located immediately adjacent and beneath incident active surface 102 and gradually extended to a maximum depth within device wafer 100.

Figure 6:
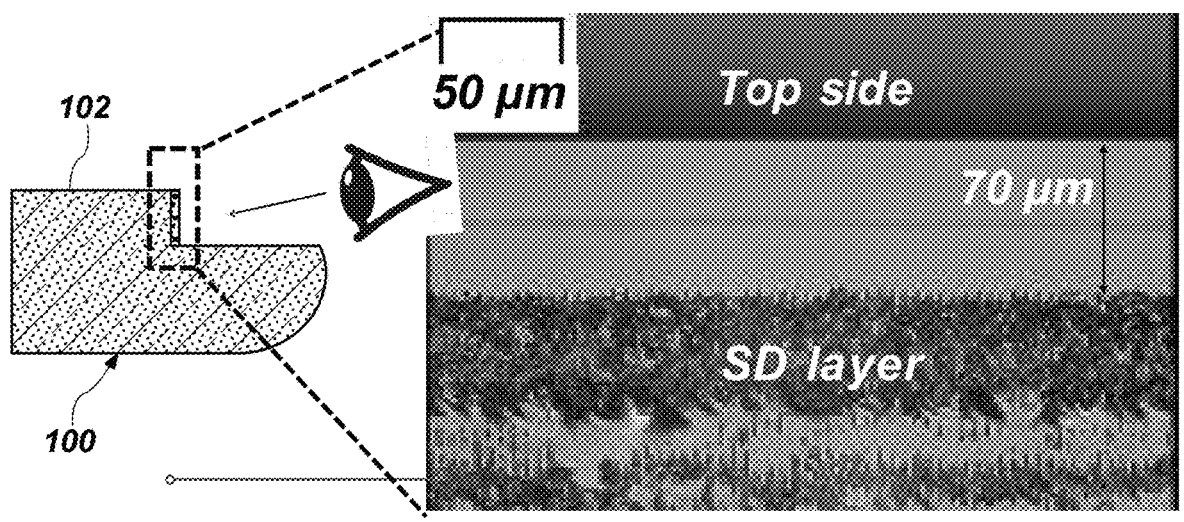
FIG. 6 is a microphotograph of an edge area of a semiconductor wafer after trimming with prior laser treatment.

As shown in FIG. 3B, after removal from the stage of laser tool 300, device wafer 100 is then rotated about vertical central axis $A_1$ by another stage S as a blade 104 of a width of, for example, about 0.5 mm to about 3 mm (depending on desired edge trim width) rotating about a horizontal axis $A_2$ perpendicular to central axis $A_1$ along a radius from axis $A_1$ is placed in contact with the active surface 102 radially outward from any integrated circuitry and radially outward but adjacent to modified zones M. Rotating blade 104 is gradually lowered to remove a depth and width of peripheral semiconductor material including that of modified zones M, and form trimmed edge 106, oriented at a 90° angle to the plane of device wafer 100. The semiconductor material may be removed, for example, to a depth of from about 130 µm to about 200 µm and to a width inwardly from peripheral edge 108 of device wafer 100 of from about 300 µm to about 500 µm. In one embodiment, the semiconductor material may be removed, for example, to a depth of about 130 µm and to a width inwardly from peripheral edge 108 of device wafer 100 of about 350 µm. Notably, rotating blade 104 is employed to remove pristine wafer material radially outward of, and closely proximate modified zones M, but out of contact with modified zones M. Due to some minimum eccentricity of the locations of modified zones M and of blade location, the distance from modified zones M to the trimmed edge may be as little as about 8 µm. After edge trim is performed, device wafer 100 is inverted and adhered to a carrier wafer 200 with a temporary adhesive 202, as shown in FIG. 3C. Suitable adhesives include, for example, thermoplastic adhesives such as WAFERBOND® HT-10.10. WAFERBOND® HT-20.20 and TA13018, each available from Brewer Science, Inc. of Rolla, Mo. Device wafer 100 is then thinned by back grinding, followed by chemical etching, plasma etching or CMP, as noted above, to a final thickness of, for example, about 70 µm to about 50 µm, as shown in FIG. 6 and referenced with respect to FIG. 7. It is contemplated that thinning in the future will extend to render device wafers as thin as at least about 30 µm. Thinned device wafer 100 may then be adhered to an adhesive film of a film frame, de-bonded from carrier wafer 200, inverted and singulated for further processing and packaging.

Unlike conventional edge trim processes, the generation of a modified zone M of semiconductor material in a stressed state and including recrystallized polycrystalline material of the wafer, microcracks, dislocations and other defects, allows blade 104 to move downwardly into unmodified, pristine material of device wafer 100 to remove such material radially outward of modified zone M while being isolated from pristine material of the device wafer 100 radially inward of modified zones M which, due to the stressed state thereof, may cleave automatically responsive to vibration of device wafer 100 induced by contact with blade 104 during the edge trim process. In other words, modified zones M provide a failure mechanism barrier along the circumference radially inward of the path of blade 104 that isolates the portion of active surface 102 device wafer 100 bearing integrated circuitry from chipping as contact with blade 104 is avoided.

Figure 5A:
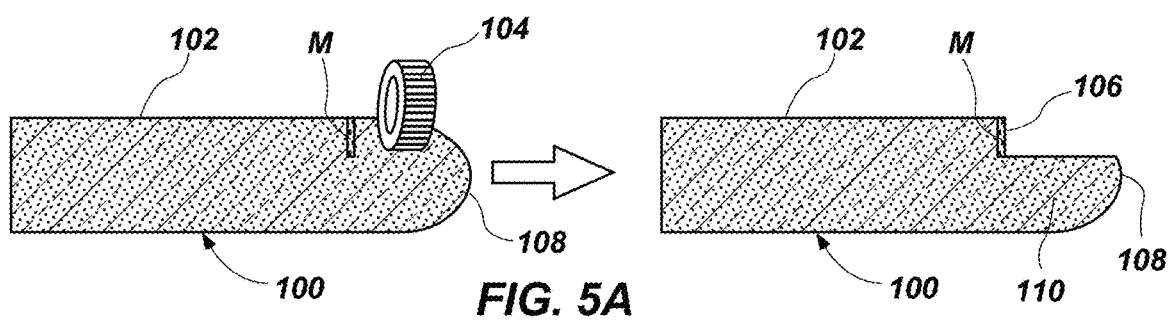
FIGS. 5A, 5B and 5C respectively schematically illustrate various implementations of embodiments of the disclosure utilizing a laser beam as depicted in FIG. 4.
Figure 5B:
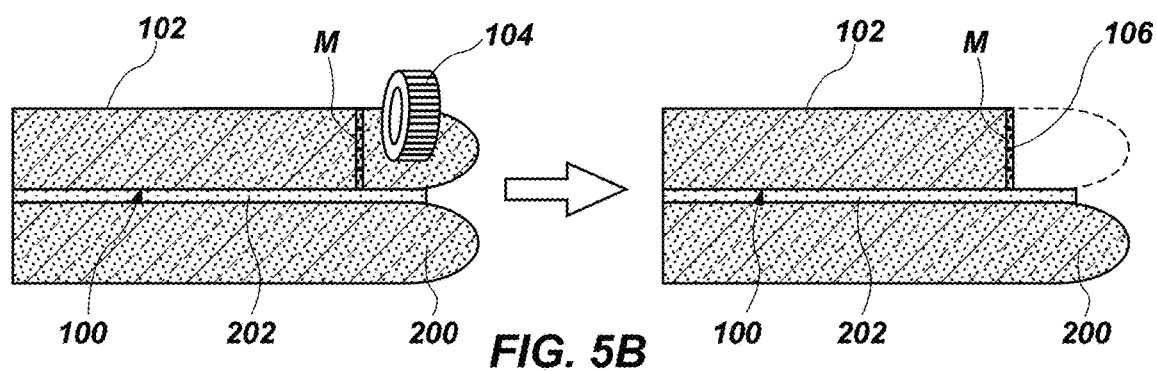
Figure 5C:
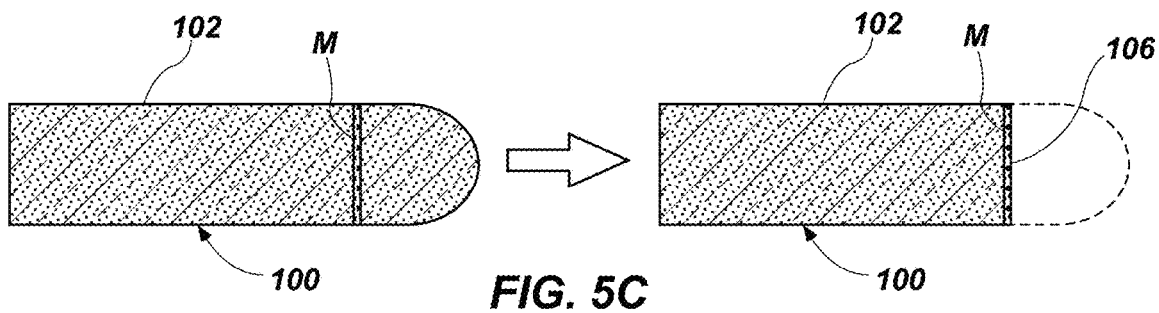

Various implementations of the embodiment fundamentals of FIGS. 3A through 3D are depicted, respectively, in FIGS. 5A, 5B and 5C. As shown in FIG. 5A, modified zones M of device wafer 100 separate pristine material thereof radially inwardly and outwardly thereof. Rotating blade 104 removes pristine material radially outward of modified zones M to a selected depth and radial width as previously described, leaving a substantial thickness 110 of device wafer 100 radially outward of modified zones M and trimmed edge 106 uncut. As shown in FIG. 5B, laser beam 302 of laser tool 300 has generated modified zones M through substantially an entire thickness of device wafer 100, which has been prebonded to a carrier wafer 200 by a temporary adhesive 202. Rotating blade 104 is then applied, and pristine material of an entire thickness of device wafer 100 radially outward of modified zones M is removed, as shown in broken lines. FIG. 5C illustrates an edge trim process wherein substantially an entire thickness of device wafer 100 not bonded to a carrier wafer has modified zones M therethrough, after which edge trim has been performed. Such an edge trim process may require additional tooling for alignment of the device wafer for further processing, as the notch or flat present on wafers for rotational alignment purposes would be removed, and no carrier wafer, as in the case of FIG. 5B, is present and usable for alignment.

FIG. 6 is a photomicrograph of a device wafer 100 after edge trim according to FIG. 5A has been effected, using a relatively fine, mash #1500 blade. As can be seen, the semiconductor material cleaves cleanly to a depth designated as 70 μm along the modified zones M, referenced as "SD layer," responsive to vibrations initiated by contact of the blade 104 with device wafer 100, as previously noted.

Figure 7:
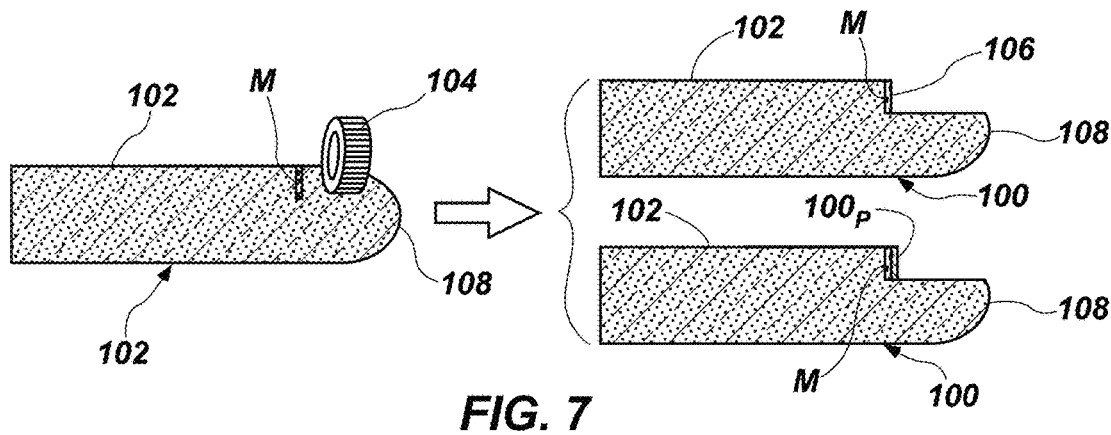
FIG. 7 schematically depicts two different implementations of an edge trim process according to the disclosure following prior laser treatment.
Figure 8:
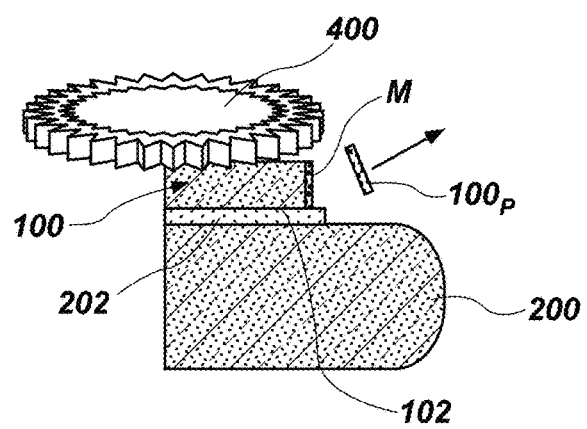
FIG. 8 schematically depicts removal of wafer edge material radially outside of the laser treatment area remaining after edge trim during back grinding of a semiconductor wafer.

FIG. 7 shows edge trimming a device wafer 100 pretreated with a laser beam 302 to generate modified zones M to a partial thickness of the wafer as previously described with respect to FIGS. 3A through 3C. Rotating blade 104 removes pristine wafer material radially outward of modified zones M, but as shown in the upper right-hand portion of FIG. 7, substantially only modified zone M itself is left intact adjacent trimmed edge 106 of pristine wafer material about a portion or portions of the circumference of device wafer 100, as previously discussed with respect to FIGS. 3A through 3C. As shown in the lower right-hand portion of FIG. 7, blade 104 may remove most of pristine wafer material radially outward of modified zones M but leaves a small thickness of pristine wafer material 100p, on the order of a few microns (e.g., about 8 μm), remains intact radially outward of modified zones M about another portion or portions of the circumference of device wafer 100. FIG. 8 shows a device wafer 100 edge trimmed according to the lower right-hand portion of FIG. 7, inverted with active surface 102 bonded to a carrier wafer 200 by adhesive 202 and being back ground by rotating grinding wheel 400. As shown, the majority of the thickness of device wafer 100 has been removed by grinding wheel 400 and, as device wafer 100 is thinned toward its final thickness of, for example about 40 μm to about 70 μm, grinding wheel contacts the pristine wafer material 100p radially outside of modified zones M, causing the small thickness of pristine wafer material 100p to cleave from modified zones M, again leaving modified zones M as a protective barrier. As one nonlimiting example, grinding wheel 400 may be used to remove material of device wafer 100 to reach a thickness of about 70 μm, followed by chemical mechanical planarization (CMP) and a dry (e.g., reactive ion) etch and, optionally, chemical vapor deposition of material followed by CMP to reach a final semiconductor wafer thickness, bearing integrated circuitry devices on an active surface, of about 50 μm as noted in FIG. 6.

Figure 9:
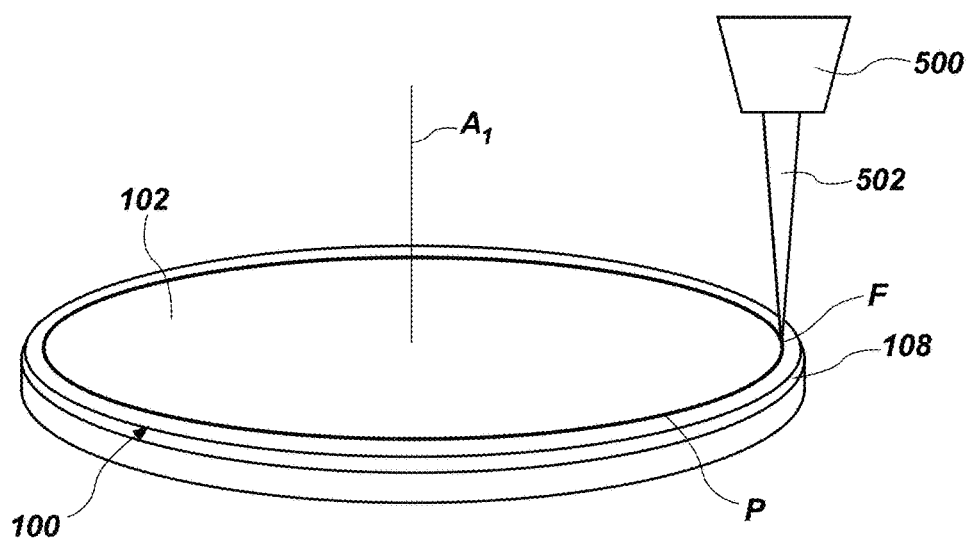
FIG. 9 is an enlarged perspective view of a laser apparatus generating a beam, focused and positioned to ablate a trench in a semiconductor wafer proximate and inward of a periphery thereof prior to edge trimming.
Figure 10:
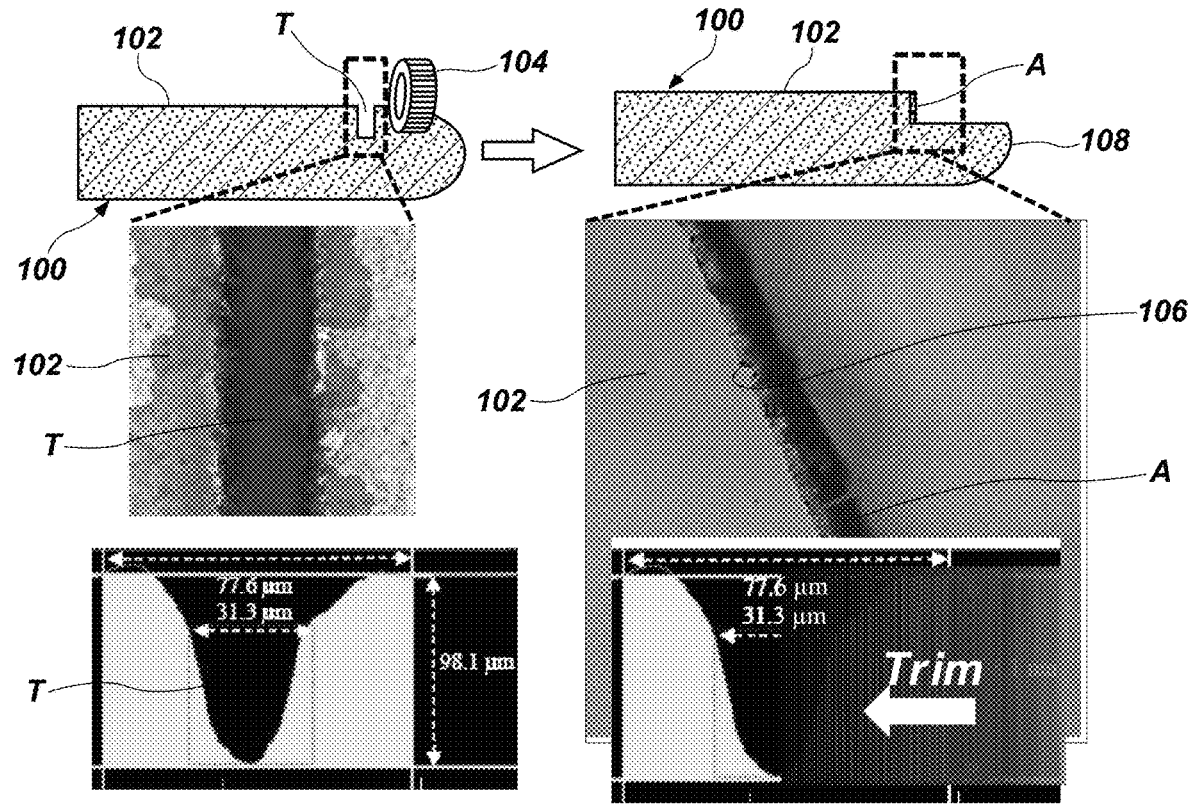
FIG. 10 depicts, on a left-hand side thereof, a blade positioned for edge trimming radially outside of a trench ablated in a semiconductor wafer, a top photomicrograph of a portion of the trench, and a side section photomicrograph of the trench and, or a right-hand side thereof, the semiconductor wafer after edge trim, a top photomicrograph of a portion of the trimmed edge, and a side section photomicrograph of the trimmed edge.

Referring now to FIGS. 9 and 10, another embodiment for edge trimming according to the disclosure is shown. In this embodiment, a laser tool 500 generating a laser beam 502 is aimed along, and within, peripheral edge 108 of a device wafer 100 at a 90° angle to a major plane of the wafer, which is mounted to a stage (not shown). As is described above with respect to the embodiment of FIGS. 3A through 3D, if the stage on which device wafer 100 is located is fixed, laser tool 500 is programmed to follow a circular path P about central axis $A_1$ of device wafer 100 inward of and adjacent to peripheral edge 108 of device wafer 100, and laser beam 502 is focused initially at the active surface 102 to ablate and vaporize semiconductor material along path P, the focal point F then being progressively moved downwardly into the semiconductor material to ablate the semiconductor material and form a trench T of desired depth, in this instance being about 100 μm, as shown schematically at the left-hand side of FIG. 10. If the stage on which device wafer 100 is located is rotatable, laser tool 500 is programmed to direct laser beam 502 at a selected radius from central axis $A_1$ of device wafer 100 inward of and adjacent to peripheral edge 108 of device wafer 100, and laser beam 502 is focused initially at the active surface 102 to ablate and vaporize semiconductor material along path P at the selected radius as device wafer 100 is rotated about central axis $A_1$, the focal point F then being progressively moved downwardly into the semiconductor material to ablate the semiconductor material and form a trench T of desired depth, in this instance being about 100 μm, as shown schematically at the left-hand side of FIG. 10. To reach this depth, multiple passes of laser beam 502 may be required, although it is contemplated that with appropriate power adjustment, a trench depth pf about 100 μm may be achieved in a single pass. In FIG. 10, the upper photomicrograph on the left-hand side of FIG. 10 shows a top view of a portion of trench T and the lower photomicrograph shows a side sectional view of the portion of trench T. While laser tool 500 may be of a general type previously described with respect to the first embodiment, notably shorter wavelengths, less than about 1000 nm, may be employed in the case of semiconductor material comprising monocrystalline silicon, so that the laser light is absorbed to melt and vaporize the semiconductor material. Laser tools suitable for use in implementation of this embodiment are offered by, among others, Disco Corporation of Tokyo, Japan, EO Technics of Anyang, Korea, ESI of Portland, Oreg., and ASM Laser Separation International of Beuningen, The Netherlands, a subsidiary of ASM Pacific Technology Ltd.

As shown in the schematic view at the left-hand side of FIG. 10, a rotating blade 104 is them employed to remove pristine wafer material radially outward of trench T from device wafer 100. As with the first embodiment, it is desirable to employ a blade with a relatively fine mash #, on the order of 1500, to produce a fine, machined surface of semiconductor material. The result, as shown at the right-hand side of FIG. 10, is removal of pristine wafer material to a depth of about 100 μm, corresponding to the depth of trench T, and radially inwardly from peripheral edge 108 a distance of about 350 μm. As shown, an altered zone A of semiconductor material exposed to the heat of laser beam 502 may remain, surrounding the remainder of active surface 102 substantially to the depth of former trench T. The upper photomicrograph at the right-hand side of FIG. 10 shows a top view of the trimmed edge 106 of device wafer 100, altered zone A and adjacent active surface 102, and the lower photomicrograph shows a side sectional view of the trimmed edge and adjacent semiconductor material extending from the bottom of the trench to the active surface. While there is a perceptible incline from the perpendicular of the trench sides and of the trimmed edge, laser tool 500 may be adjusted to optimize the shape of laser beam 502 to produce a trench with more perpendicular sides. For example, the wavelength, pulse width and intensity of laser beam 502 may be adjusted to form smooth, more vertical sidewalls of trench T. Alternatively, a second pass of laser beam 502 of a different focal point size, produced by using a different lens, may be employed after formation of trench T to render the sidewalls of trench T more vertical and produce a substantially "U" shaped trench, rather than the "V" shaped trench illustrated. In either case, the altered zone A extending peripherally about the area of the active surface 102 of device wafer 100 provides a robust barrier to chipping and/or cracking of device wafer 100 during edge trim, back grinding and CMP processing.

As will be appreciated by those of ordinary skill in the art, embodiments of the methods and apparatus of the disclosure provide straightforward, repeatable approaches to reduce wafer chipping and cracking during edge trim, as well as back grinding and CMP processing, enhancing processing reliability and increasing semiconductor die yield from wafers.

In an embodiment, a method comprises forming modified zones in material of at least a partial thickness of a semiconductor wafer inwardly of and adjacent to a peripheral edge thereof, and contacting the semiconductor wafer between the modified zones and the peripheral edge of the wafer with a blade to remove material to substantially the at least a partial thickness.

In another embodiment, a method comprises forming a trench in semiconductor material of a wafer inwardly of and adjacent to a peripheral edge thereof, and contacting the wafer between the trench and the peripheral edge of the wafer with a blade to remove semiconductor material to substantially a depth of the trench.

In a further embodiment, an apparatus comprises a stage configured to receive one of a device wafer or a carrier wafer having a device wafer mounted thereon, and a laser tool located above the stage and oriented to direct a laser beam downwardly toward the stage, the laser tool configured for generating a laser beam and adjusting a focal point of the laser beam vertically, wherein at least one of the stage is rotatable or the laser tool is programmable to direct the laser beam in a path radially inwardly of a peripheral edge of a device wafer supported by the stage.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A method, comprising:
    forming modified zones in material of at least a partial thickness of a semiconductor wafer inwardly of and adjacent to a peripheral edge thereof; and
    contacting the semiconductor wafer between the modified zones and the peripheral edge of the semiconductor wafer with a blade to remove material of the semiconductor wafer to substantially the at least a partial thickness.

2. The method of claim 1, wherein forming modified zones in material of a semiconductor wafer comprises directing a focal point of a laser beam to one or more locations within the material while at least one of moving the laser beam about a vertical central axis of the semiconductor wafer or rotating the semiconductor wafer about the vertical central axis, to form circumferentially extending modified zones.

3. The method of claim 2, wherein directing a focal point of a laser beam to one or more locations within the material comprises moving the focal point of the laser beam vertically within the semiconductor wafer.

4. The method of claim 2, further comprising:
    moving the laser beam about a vertical central axis of the semiconductor wafer, or rotating the semiconductor wafer about the vertical central axis, while directing a focal point of a laser beam to locations within the semiconductor wafer to form modified zones throughout substantially an entire thickness of the semiconductor wafer; and
    removing material of an entire thickness of the semiconductor wafer radially outward of the modified zones with the blade while rotating the blade about a horizontal axis.

5. The method of claim 4, further comprising mounting the semiconductor wafer to a carrier wafer prior to forming the modified zones.

6. The method of claim 1, further comprising mounting the semiconductor wafer to a carrier wafer after forming the modified zones, and rotating the semiconductor wafer on the carrier wafer while contacting the semiconductor wafer with the blade while rotating the blade about a horizontal axis.

7. The method of claim 1, wherein contacting the semiconductor wafer between the modified zones and the peripheral edge of the semiconductor wafer with a blade to remove material to substantially the at least a partial thickness further comprises removing substantially all semiconductor wafer material to the at least a partial thickness radially outward of the modified zones about at least a portion of a circumference of the semiconductor wafer.

8. The method of claim 1, wherein contacting the semiconductor wafer between the modified zones and the peripheral edge of the semiconductor wafer with a blade to remove material to substantially the at least a partial thickness further comprises leaving a portion of material to the at least a partial thickness located radially outward of the modified zones about at least a portion of a circumference of the semiconductor wafer.

9. The method of claim 8, further comprising, after material of the semiconductor wafer is removed to substantially the at least a partial thickness:
    inverting the semiconductor wafer and mounting the semiconductor wafer to a carrier wafer; removing material of the semiconductor wafer from a surface thereof opposite the carrier wafer to a selected thickness with a grinding wheel; and
    removing the portion of material of the semiconductor wafer to the at least a partial thickness radially outward of the modified zones responsive to contact thereof with the grinding wheel.

10. The method of claim 1, further comprising, after material of the semiconductor wafer is removed to substantially the at least a partial thickness:
    inverting the semiconductor wafer and mounting the semiconductor wafer to a carrier wafer; and removing material of the semiconductor wafer from a surface thereof opposite the carrier wafer to reach a selected wafer thickness.

11. The method of claim 1, wherein contacting the semiconductor wafer between the modified zones and the peripheral edge of the semiconductor wafer with a blade comprises lowering a blade rotating about a horizontal axis to contact the semiconductor wafer during rotation of the semiconductor wafer about a central vertical axis, and lowering the blade to remove semiconductor material to substantially the at least a partial thickness.

12. A method, comprising:
    forming a trench in semiconductor material of a wafer inwardly of and adjacent to a peripheral edge thereof; and contacting the wafer between the trench and the peripheral edge of the wafer with a blade to remove semiconductor material to substantially a depth of the trench.

13. The method of claim 12, wherein forming a trench in semiconductor material of a wafer comprises:
   directing a focal point of a laser beam into a surface of the semiconductor material of the wafer to ablate semiconductor material while at least one of moving the laser beam about a central vertical axis of the wafer or rotating the wafer about the central vertical axis; and
   optionally, moving the focal point of the laser beam downwardly into the semiconductor material of the wafer during the at least one of moving the laser beam or rotating the wafer about the central vertical axis to increase a depth of the trench.

14. The method of claim 13, further comprising directing another laser beam into the trench after formation of the trench to render sidewalls of the trench more vertical.

15. The method of claim 13, wherein ablating semiconductor material comprises melting and vaporizing semiconductor material to form altered zones of semiconductor material defining at least sidewalls of the trench, and further comprising removing semiconductor material between a peripheral edge of the wafer and a radially inward sidewall of the trench with the blade, leaving an altered zone defining the radially inward sidewall of the trench substantially intact.

16. The method of claim 12, further comprising, after semiconductor material of the wafer is removed to substantially the depth of the trench:
   inverting the wafer and mounting the wafer to a carrier wafer; and removing semiconductor material of the wafer from a surface thereof opposite the carrier wafer to leave a selected thickness of semiconductor material less than a depth of the trench.

17. The method of claim 12, wherein contacting the wafer between the trench and the peripheral edge of the wafer with a blade comprises lowering a blade rotating about a horizontal axis to contact the wafer during rotation of the wafer about a vertical axis, and lowering the blade to remove semiconductor material to substantially the depth of the trench.

18. An apparatus, comprising:
   a stage configured to receive one of a device wafer or a carrier wafer having a device wafer mounted thereon;
   a laser tool located above the stage and oriented to direct a laser beam downwardly toward the stage, the laser tool configured for generating a laser beam and adjusting a focal point of the laser beam vertically;
   wherein at least one of the stage is rotatable about a vertical axis or the laser tool is programmable to direct the laser beam in a path radially inwardly of a peripheral edge of a device wafer supported by the stage;
   another stage configured to receive the one of a device wafer or a carrier wafer having a device wafer mounted thereon and rotatable about a vertical axis; and
   a vertically movable blade rotatable about a horizontal axis along a radius from the vertical axis of the another stage and positionable over the device wafer or the device wafer mounted on the carrier wafer received on the another stage proximate to and radially inward of an outer periphery thereof.

19. The apparatus of claim 18, wherein the laser tool is configured to generate a vertical laser beam within a range of wavelengths transmissible through semiconductor material of a device wafer.

20. The apparatus of claim 19, wherein the range of wavelengths comprises wavelengths at least greater than about 900 nm.

21. The apparatus of claim 18, wherein the laser tool is configured to generate a vertical laser beam within a range of wavelengths selected to ablate semiconductor material of a device wafer.

22. The apparatus of claim 21, wherein the range of wavelengths comprises wavelengths at least greater than about 1000 nm.

* * * * *

UNITED STATES PATENT AND TRADEMARK OFFICE
CERTIFICATE OF CORRECTION

PATENT NO. : 11,538,711 B2
APPLICATION NO. : 16/042597
DATED : December 27, 2022
INVENTOR(S) : Jing-Cheng Lin It is certified that error appears in the above-identified patent and that said Letters Patent is hereby corrected as shown below:

In the Claims

Claim 16, Column 11, Line 33, change "wafer; and removing" to --wafer; and removing--

Signed and Sealed this
Twenty-seventh Day of June, 2023

Katherine Kelly Vidal
*Director of the United States Patent and Trademark Office*